United States Patent [19]

Mountford et al.

[11] Patent Number: 5,318,031
[45] Date of Patent: Jun. 7, 1994

[54] METHOD AND APPARATUS FOR DETERMINING CHEMICAL STATES OF LIVING ANIMAL OR HUMAN TISSUE USING NUCLEAR MAGNETIC RESONANCE

[75] Inventors: Carolyn E. Mountford, East Ryde; Peter Russell, Camperdown, both of Australia

[73] Assignee: Bruker Analytische Messtechnik GmbH, Fed. Rep. of Germany

[21] Appl. No.: 842,148

[22] PCT Filed: Jul. 23, 1990

[86] PCT No.: PCT/DE90/00556

§ 371 Date: May 19, 1992

§ 102(e) Date: May 19, 1992

[87] PCT Pub. No.: WO92/01946

PCT Pub. Date: Feb. 6, 1992

[51] Int. Cl.$^5$ .............................................. A61B 5/055
[52] U.S. Cl. ................................. 128/653.2; 436/64; 436/86; 436/173
[58] Field of Search ................. 128/653.2; 436/64, 86, 436/173

[56] References Cited

U.S. PATENT DOCUMENTS

| | | | |
|---|---|---|---|
| 3,789,832 | 2/1974 | Damadian | 128/653.2 |
| 4,885,236 | 12/1989 | Penman et al. | 436/64 |
| 5,162,202 | 11/1992 | Shamsuddin | 436/64 |

FOREIGN PATENT DOCUMENTS 0125651  5/1984  European Pat. Off. .

OTHER PUBLICATIONS

H. Konig, K. Aicher, U. Klose, J. Saal; "Die quantitative Beurteilung von ... " electromedica 58 (1990); pp. 14–22.

M. B. Merickel, C. S. Carman, S. Ware, J. D. Pearlman, J. Brookeman, J. Mugler & C. Ayers; "Multidimensional MRI Pattern Recognition of Atherosclerosis"; IEEE/Eighth Annual Conference of the Engineering in Medicine and Biology Society (Nov. 7–10, 1986); pp. 1142–1145.

Peter Pfandler, Geoffrey Bodenhausen, Beat U. Meier, R. R. Ernst; "Toward Automated Assignment of Nuclear Magnetic Resonance Spectra: Pattern Recognition in Two-Dimensional Correlation Spectra"; 266B Analytical Chemistry 57 (1985) Nov., No. 11, Washington, USA; pp. 2510–2516.

*Primary Examiner*—Ruth S. Smith
*Attorney, Agent, or Firm*—Claude A. S. Hamrick

[57] ABSTRACT

In a method for determining chemical states of living animal or human tissue using nuclear magnetic resonance with a homogeneous constant magnetic field, the tissue is measured by means of a high-resolution nuclear magnetic resonance measurement and the measured values obtained are then evaluated by comparison with measured values from resonance measurements on comparable tissue to determine whether the chemical state of the tissue corresponds to a chemical normal state or to a deviating abnormal state. In order to enable a determination of chemical intermediate states to be made, it is proposed to compare the measured values obtained with such a series of reference measurements which also contain the detectable characteristic transition states between the chemical normal state and the abnormal end state and that the chemical transition state of the measured tissue sample is determined from the comparison.

25 Claims, 10 Drawing Sheets

10

METHOD AND APPARATUS FOR DETERMINING CHEMICAL STATES OF LIVING ANIMAL OR HUMAN TISSUE USING NUCLEAR MAGNETIC RESONANCE

BACKGROUND OF THE INVENTION

1. Field of the Invention

The invention relates to a method for determining chemical states of living animal or human tissue using nuclear magnetic resonance with a homogeneous constant magnetic field, the tissue being measured by means of a nuclear magnetic resonance measurement and the measured values obtained then being evaluated by comparison with measured values from reference measurements on comparable tissue to assess whether the chemical state of the tissue corresponds to a chemical normal state or to a deviating abnormal end state.

The invention also relates to an apparatus for determining chemical states of living animal or human tissue using nuclear magnetic resonance, comprising a high resolution nuclear magnetic resonance spectrometer for carrying out a nuclear magnetic resonance measurement on the tissue, means for determining measured values for the nuclear magnetic resonance measurement on the tissue, means for storing reference values for measurements on comparable tissue and means for comparing the measured values from the actual measurement and the reference measurement.

2. Description of the Prior Art

A method of this type and an apparatus of this type are disclosed in U.S. Pat. No. 3,789,832.

In the case of the known method, the tissue is placed in a homogeneous constant magnetic field and is then measured by means of a nuclear magnetic resonance measurement (relaxation time measurement). With this method the tissue can be measured as a tissue sample in vitro, or in vivo, in which case the entire human or animal body is introduced into the homogeneous constant magnetic field.

During the measurement, the magnetic resonance of the protons of the total water in the tissue is measured. This method is based on the knowledge that, starting from a normal state, which corresponds to a healthy state of the tissue, the degree of association of such water molecules, which are associated with protein chains in the cell membranes, can change to an abnormal end state deviating from said normal state, this change being detectable via a nuclear magnetic resonance measurement. The abnormal end state corresponds to that of a malignant tumor. If measured values are now available for the corresponding tissues in both states, that is to say the normal state and the abnormal end state, it is possible, from a comparison of these measured values with the measured values of the tissue actually measured, to make an allocation, that is to say to determine in which of the two states the tissue was at the time of the measurement.

A disadvantage of a method of this type and an apparatus of this type is that it is possible to make only a yes/no statement, i.e. whether the tissue is in the one or the other state. The statement that the tissue is in the abnormal end state with coarse morphological changes can also be furnished in a simpler manner by conventional histological methods and provides no information with regard to chemical processes or intermediate states. If the association of the water molecules with the protein chains in the cell membranes has changed to such an extent that this is detectable by the said nuclear magnetic resonance measurements, then there is already a tumor in a developed state, i.e. a proliferation penetrating into other cells with the formation of metastases. In this advanced state, a medical treatment of the tissue is possible only with difficulty and usually is not successful. It is true that it is possible to make certain statements with regard to the severity of the malignancy from the measurements made in accordance with the method mentioned initially, but the prerequisite for this is that a malignant tumor is already present, i.e. the statement with respect to the abnormal end state can at best be differentiated to indicate to what extent this state is advanced within the tissue sample measured.

A further disadvantage of the method mentioned initially is that the change in the extent of the association of the water molecules with the proteins of the cell membrane must manifest itself, i.e. that the measured change can be detected only as a consequence of a tumor growth. Other chemical changes, which take place earlier or are even a possible cause of the subsequent development of a malignant tumor, are not detected.

The document EP-A2-0 234 524 discloses a method with which, on the basis of nuclear magnetic resonance measurements on liquid samples, for example blood plasma, serum or the like, resonance lines in the resulting spectrum are selected which are associated with chemical substances other than water and which are compared with corresponding characteristic lines in reference spectra which correspond to the deviating abnormal chemical state in which these substances are likewise present. In the case of the comparison method, the half-width values (line width in the spectrum at half the height of a line) are used and protons of various classes of lipoproteins can be assigned to the selected lines. The "Fossel indices" derived therefrom are, it is true, numerical values which are manageable in practice, but which enable only a yes/no statement with regard to normal state or malignant end state and which at best enable a differentiation with regard to the degree of the malignancy of the end state reached. Lipoproteins can also be found in the case of chemical changes in the blood which are not to be ascribed to a malignant tumor. Furthermore, for it to be possible to determine a malignant end state of a tissue, this end state must already be very far advanced, in order to draw reliable statements from the plasma, which statements are also made more difficult because other atypical frequencies can be observed in the selected frequency range in the plasma (in this context see G. N. Chmurny et al., "A NMR Blood Test for Cancer: a Critical Assessment", NMR in Biomedicine, Vol. 1, No. 3, 1988).

By means of high resolution nuclear magnetic resonance measurements, proteolipids can be used both in one-dimensional and in two-dimensional (2D-COSY=two-dimensional scalar correlated spectroscopy) spectra to determine the chemical state of tissue. L. C. Wright et al., "A proteolipid in cancer cells is the origin of their high-resolution NMR spectrum", FEBS letters, Vol. 203, No. 2, pp. 164–168 (1986).

In the case of the method known from this publication also, the proteolipids are determined in the plasma and at best permit a conclusion to be drawn with respect to a serious malignant end state of the tissue. It is true that is has become known from this that, by means of high resolution nuclear magnetic resonance measurements, certain substances which are characteristic for the chemical end state can possibly already be determined at a time at which conventional histological methods are not yet able to do this, but this procedure likewise permits only the statement that this end state, that is to say the malignant state of the tissue, already exists.

Further studies have supported the abovementioned findings, that is to say that by means of high resolution nuclear magnetic resonance measurements the chemical end states of tissue, which correspond to malignant states, can possibly be recognised at a considerably earlier time than is possible using conventional histological methods (C. E. Mountford et al. "Classification of Human Tumours by High-Resolution Magnetic Resonance Spectroscopy", THE LANCET, Vol. 1, Mar. 22, 1986, pp. 651-653). It is again a disadvantage of this procedure is that at best the chemical end state can be recognised at an earlier time, but this end state must likewise already exist.

Further studies have shown that nuclei other than protons, that is to say, for example, phosphorus or fluorine nuclei, can also be used in nuclear magnetic resonance measurements for the determination of the chemical state of tissue, this being possible in the case of human and animal body tissues of various types. (C. E. Mountford et al., "NMR Analysis of Cancer Cells" Progress in Clinical Biochemistry and Medicine, 1986, Vol. 3, pp. 73-112).

It is a common disadvantage of all of the above-mentioned methods and apparatuses that they enable only a statement to be made with regard to whether a specific chemical end state already exists, it being possible at best to make a differentiation with respect to the extent to which this chemical state is already advanced in the tissue.

SUMMARY OF THE INVENTION

The object of the present invention is, therefore, to overcome these disadvantages and to provide a method and an apparatus by means of which the chemical transition states between a chemical normal state and a deviating abnormal end state can be determined.

According to the invention, the object is achieved in the case of a method of the initially mentioned type by the fact that the measured values obtained are compared with such a series of reference measurements which also contain the detectable characteristic transition states between the chemical normal state and the abnormal end state and that the chemical transition state of the measured tissue sample is determined from the comparison.

According to the invention, the object is achieved in the case of an apparatus of the initially mentioned type by the fact that the means for storing reference values consist of a database which contains a series of reference values for reference measurements which also comprise the detectable characteristic transition states between the chemical normal state and the chemically abnormal end state and that a computation unit is provided which, from the comparison of the measured values, makes an assignment of the actual measurement to a chemical transition state.

The object according to the invention is thus achieve in full because it is possible, by means of the comparison with measured values for transition states, which are not yet characteristic for the end state itself, to classify the actual chemical state of the measured tissue in a qualified manner between the two limiting states, that is to say the normal state (healthy) and the abnormal end state (malignant). This is based on the knowledge that the transformation from a chemical normal state to an abnormal end state deviating therefrom proceeds via characteristic chemical transition states which are detectable by means of nuclear magnetic resonance measurements. Intensive research has shown that the change of the tissue from a chemically normal state to an abnormal end state deviating therefrom proceeds via multi-stage chemical processes in which characteristic substances are formed or consumed, which substances can be detected via nuclear magnetic resonance measurements. For this purpose it is then necessary to compile a database containing a series of measured values for reference measurements for these transition states, which compilation, for example, can be carried out by measuring corresponding tissue samples from various animal or human individuals in various chemical states by means of nuclear magnetic resonance measurements, and storing the corresponding data in the database. The measured values for an actual measurement on the tissue is then compared with the characteristic reference values in this database and the actual chemical state of the tissue is determined from this comparison. The characteristic data for the determination of the transition state of a cell are obtained by storing and classifying a large number of measurements on corresponding tissue from various individuals in various chemical states, for example for various age groups with a wide scatter. Thus, numerous nuclear magnetic resonance measurements carried out over a prolonged period have clearly shown that, for example, healthy human tissue, as is explained in more detail below with reference to the illustrative embodiments, passes through clearly detectable intermediate states during the transformation to a tissue attacked by cancer. These chemical intermediate states, which have not yet led to the end state, that is to say, for example, to a malignant carcinoma, can be prevented from further developing towards an abnormal end state by means, for example, of chemical or early surgical measures, so that said end state, which is destructive to the tissue and ultimately also to the corresponding animal or human body, is no longer reached. The method according to the invention thus permits early recognition and thus also the possibility for early treatment of tissue threatened by cancer.

In a further embodiment of the invention, the tissue is measured using a high-resolution, in particular a two-dimensional, for example a 2D-COSY nuclear magnetic resonance measurement and compared with a series of corresponding measurements for various chemical transition states of corresponding tissue.

This measure has the advantage that an additional resolution of the multiplicity of resonance signals, which in the one-dimensional spectrum are otherwise overlapping, can be achieved by means of two-dimensional nuclear magnetic resonance spectroscopy. Thus, for example, it is possible to identify chemically very similar $CH_3$ groups on the basis of their bonding to adjacent $CH_2$ or CH groups and from this identification to assign the particular $CH_3$ group to a specific compound, for example an amino acid in the tissue. It has been found that when the chemical state of the cells of human tissue is changed various metabolites, for example amino acids, are produced or liberated, which metabolites can be detected within the framework of a single measurement by means of two-dimensional nuclear magnetic resonance spectroscopy.

In a further embodiment of the invention, at least one characteristic cross-peak is selected as criterion for the comparison between actual measured values for the tissue and the series of reference measured values and it is determined whether or not the at least one cross-peak is present.

This measure has the advantage that a transition state can be determined by comparisons which are simple to carry out.

In a further embodiment of the invention, the tissue is irradiated frequency-selectively with one or more high-frequency pulses, in particular the first high-frequency pulse generating the transverse magnetisation, during the high-resolution two-dimensional nuclear magnetic resonance measurement of the tissue, the band width of the high-frequency pulse comprising at least the resonance frequency of a molecule characteristic for a chemical transition state.

This measure has the advantage that in the first time domain (excitation phase) only those groups, for example CH groups, are excited which occur in metabolites which are characteristic for chemical transition states of tissue, so that in the second time domain (detection phase) it is then only the information with regard to the bonding of these CH groups to other groups, for example $CH_3$ groups, of the particular metabolite which is obtained in order to ensure an unambiguous identification of the particular metabolite.

This has the advantage that those measurements which provide the necessary information for characterization of a specific transition state can be carried out very rapidly and in a targeted manner.

In a further embodiment of the invention, when a nuclear magnetic resonance measurement is carried out, after radiation of a first pulse generating the transverse magnetisation, further pulses, in particular 180° pulses, are radiated in the number required, before the pulse used for measurement of the free induction decay, until the condition $m.t_e$ greater than $T_2$ is met for the undesired signals, m being the number of further pulses, $t_e$ the spin echo evolution time and $T_2$ the transverse relaxation time after the pulse of the undesired signals used for measurement of the free induction decay.

As a result of this measure, a $T_2$-filtered spectrum is obtained, from which the signals which are not meaningful have been filtered out, so that only the signals to be checked are detected.

This measure has the advantage that the measurement results can be presented using simple spectra, which then can be evaluated correspondingly rapidly and simply, either visually or also by means of computer-controlled units.

In a further embodiment of the invention, the chemical transition states of the tissue between normal state and end state are subdivided into "non-critical", "dubious" and "pre-malignant" states, the corresponding measured values for the reference measurements being assigned to these groups of states so that on comparison of the measured values of the measured tissue an allocation to a group of pre-defined chemical transition states takes place at the same time.

This measure has the advantage that the determination is simplified to the extent that, as a result of the grid-like classification of the various chemical states, the particular state can be assigned in a particularly easily discernible manner. This opens up the possibility for routine determinations using the method according to the invention, which determinations provide even a layman with meaningful information on the particular chemical state of the tissue without further differentiated explanations or interpretations. The comparison of an actual measured spectrum with stored reference spectra can be carried out visually but also, preferably, automatically, for example via a program for automatic spectrum recognition. In the case of the automatic detection and computation of measured values it is not necessary to record a complete 2D spectrum, but under certain circumstances it suffices to measure only the relevant cross-peaks in a targeted manner and to compare these with predetermined threshold values. This restriction saves measurement time, or for a given measurement time permits a higher resolution in the field of interest.

In a further embodiment of the invention, those values which correspond to chemical intermediate states of the tissue which originate from chemical changes which are not directly involved in the direct chemical transformation process between the normal state and the abnormal end state, but for which there exists the possibility that they may result in the transformation process leading to the abnormal chemical end state, are added to the series of reference measurements.

This measure has the advantage that those chemical transformation processes which originate from other chemical transformation processes but which, in the course of their transformation, reach a stage which can also lead to the chemically abnormal end state of the tissue are also taken into account in the determination method. From the practical standpoint this is of significance to the extent that a tissue can enter into the transformation process leading to the chemically abnormal end state as a result of diverse triggering events. Thus, for example, an illness attacking the tissue can change this chemically, without this initiating a chemical process such as leads to the chemically abnormal end state. It is, however, possible that a trigger substance is present as a latent substance in a tissue which has been attacked by such a disease, which trigger substance is still able to initiate a transformation process to the chemically abnormal end state at a very much later time. Thus, if the trigger substance present as a latent substance is detected via a nuclear magnetic resonance measurement, this can be stored and can then be taken into account during subsequent determinations. Thus, for example, it has been found that women in whom the tissue of the cervix has been attacked by papilloma viruses are exposed to an increased risk of cancer of the cervix. Tissue which has been attacked by the papilloma virus contains substances which are detectable by means of nuclear magnetic resonance measurement and which are then included in the set of reference measurement measured values. It is thus not only possible to establish the actual condition of attack by the papilloma virus but also, at the same time, to document in good time the latent risk of the development to a malignant cancer and to take this into account during subsequent measurements.

In a further embodiment of the invention, a tissue sample obtained by biopsy or a cell mass obtained by culture is subjected to nuclear magnetic resonance measurement in vitro. Within the context of the present invention, the term "tissue" is also to be understood to include such cell masses.

This measure has the advantage that the method can be carried out using simple apparatus and that the tissue sample can be prepared by measurement techniques by means of suitable ancillary units.

It is also possible to record in vivo nuclear magnetic resonance spectra volume-selectively, i.e. only for a specific, spatially defined area of a sample. Using this recording technique it is, specifically, possible, for example, to record on a living body a nuclear magnetic resonance spectrum of a specific defined point in an internal organ of the body. The recording of volume-selective nuclear magnetic resonance spectra is a technique known per se. Examples are given in the textbook by Wehrli, Derek Shaw and J. Bruce Kneeland "Biomedical Magnetic Resonance Imaging", Verlag Chemie, 1988, pages 1 to 45 and 521 to 545.

In a further embodiment of the invention, the evaluation is carried out on those cross-peaks in a 2D-COSY proton spectrum which correspond to the metabolites characteristic for the transformation process and in particular to the amino acids needed for building up human protein. The sample used is in particular a tissue sample from the neck of the uterus (cervix uteri) and if cross-peaks of at least one of the amino acids isoleucine (Ile), leucine (Leu), valine (Val) and/or phenylalanine (Phe) are present in the tissue sample the chemical state is assessed as "pre-malignant".

These measures have the advantage that certain chemical states, for example a state which is not yet alarming for the tissue but to a high degree is suitable for transition to the critical abnormal chemical state, can be detected via specific parameters. In practical application, this has the advantage that tumors which have not yet developed into a histologically recognisable malignant carcinoma can be recognised and classified and can be clearly differentiated from the latter, it being possible to remove a tumor which is still in the "pre-malignant" stage by operative or chemical treatments without the remaining tissue being seriously impaired and, in particular, before a malignant state causing metastases is reached.

In a further embodiment the evaluation for determination of the chemical state is carried out on those cross-peaks which, in addition to the signals characteristic for the "pre-malignant" state, are assignable to lactate, such a chemical state being classified as "malignant end state".

This measure has the advantage that a relatively sharp boundary is provided between the "pre-malignant" and the "malignant end state" and a clear differentiation of the chemical state in the region of the critical transition between "pre-malignant" and "malignant" is thus possible.

In a further embodiment of the invention, a proton nuclear magnetic resonance measurement is carried out in which the water signal is suppressed by presaturation.

This measure has the advantage that the intense signal of the water, which is present in a large excess compared with the characteristic substances, is suppressed, so that signals of metabolites in low concentration which are of interest can then also be determined without interference.

This measure also has the advantage that, for example, the entire sample taken from a tissue can be measured in an aqueous medium, so that even very small amounts of characteristic substances, which are also present in only a few cells, can already be recognised.

Thus, there is not the risk, as in the case of conventional histological tissue sample studies, that those tissue sections which contain the changed chemical state may possibly not be present in the section actually used for examination.

Further advantages are apparent from the description and the appended drawings. It is understood that the features which have been mentioned above and which are still to be explained below can be used not only in the particular combination indicated but also in other combinations or on their own, without going beyond the scope of the present invention. Certain illustrative embodiments of the invention are shown in the drawings and are explained in more detail in the description which follows. In the drawing:

DESCRIPTION OF THE PREFERRED EMBODIMENTS

Figure 1:
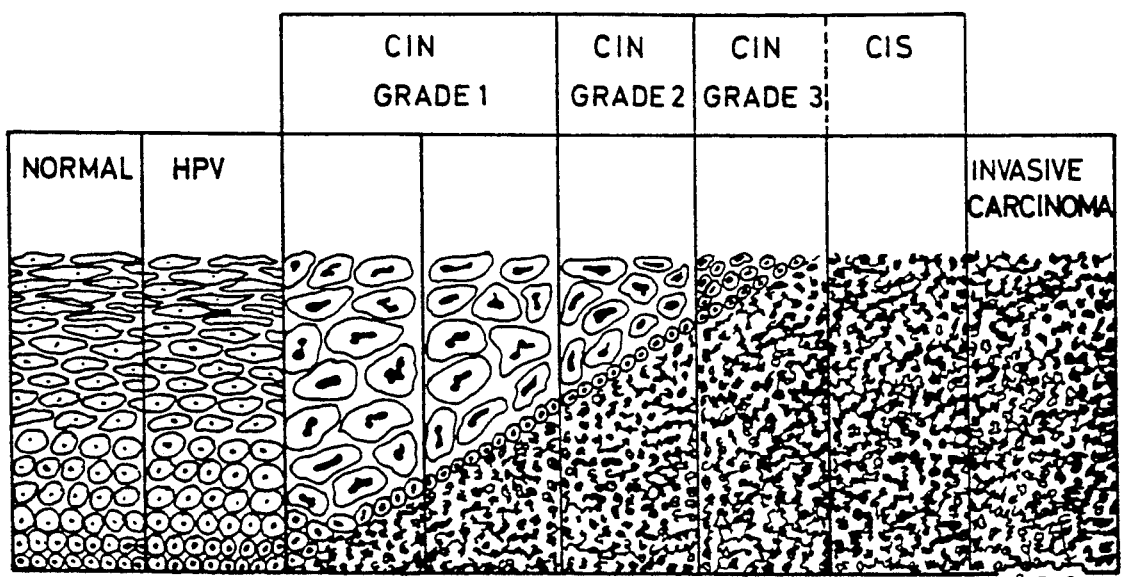
FIG. 1 shows a diagrammatic representation of different chemical states of human tissue.

FIG. 1 shows, highly diagrammatically, various states of development of tissue in the region of the neck of the uterus (cervix uteri) of a female person. In this figure the tissue shown on the left-hand side corresponds to a NORMAL state with a normal cell picture. This is followed by a cell picture such as results in the case of an infection with papilloma viruses (Human Papilloma Virus). No discernible changes have taken place at the tissue itself. Vesicular vacuoles can also be observed. The tissue picture designated by HPV is followed by a state of development with an intraepithelial neoplasia of the cervix, designated by CIN (Cervical Intraepithelial Neoplasia). Two grade 1 regions are differentiated, that is to say those having very slight and slight epithelial dysplasia. In the states of development designated grade 1 more or less pronounced metaplastic, degenerative or regenerative changes of the tissue take place. In the state of development of medium-grade dysplasia designated grade 2 severe degenerative changes of the cells have already taken place and a large number of regressively changed cells are already present.

This region is followed by a region of severe dysplasia which is designated grade 3 and which can already be regarded as a precursor of a carcinoma. In the sense of the present application, this state is already regarded as "pre-malignant". In this state the tissue cannot yet be recognised or classified as carcinoma by means of the conventional histological methods. In this state the tissue can regress to a normal state again, the regression rate being only about 20%, compared with which the regression rate in the case of moderate dysplasia is nevertheless still 50%.

In the state of development designated CIS (Carcinoma In Situ) a carcinoma has formed which is not yet invasive, that is to say there is still no proliferation into tissue of a different type, that is to say no metastases have formed as yet.

The tissue has reached its chemically deviating end state in its entirety if it is essentially composed of malignant tumor cells which are invasive, as is indicated in FIG. 1 by an arrow 10.

Studies have shown that tissue from the neck of the uterus which is in the grade 1 state (slight to moderate dysplasia) is transformed to grade 2 tissue over an average transformation period of 6 years. The average period for transformation from grade 2 to grade 3 is about 3 years. The transformation period from grade 3 to CIS is about 1 year.

It has also been observed that over a period of ten years about 70% of tissue graded CIS continues to develop to an invasive carcinoma.

Promising methods of treatment are available up to the CIS state, and in the transition phase from grade 1 to grade 3 chemical treatment methods are still possible, without a surgical operation being necessary.

The transitions from the NORMAL state, which corresponds to a chemical normal state of the tissue, shown on the left-hand side of FIG. 1, to the invasive carcinoma, which corresponds to an abnormal chemical end state of the tissue, shown on the right-hand side, can be determined on the basis of the 2D-COSY spectra shown below.

A tissue sample ($1 \times 2 \times 3$ mm) of cervix uteri from female test persons is taken in each case for carrying out the measurements which lead to the 2D-COSY spectra shown in FIGS. 2 and 5 to 11. These samples are placed in an isotonic saline phosphate buffer (PBS) in $D_2O$, shock-frozen in liquid nitrogen and then stored at $-70°$ C. For carrying out the measurement, the tissue sample, after thawing, is washed again with PBS/$D_2O$ and placed on a glass wool plug in a 5 mm measuring tube. The sample is then covered with a layer of a PBS/$D_2O$ mixture. The 2D-COSY measurements were carried out at 37° C. using a Bruker WM-400 spectrometer (9.4 Tesla), which was equipped with an Aspect-2000 computer (Bruker/Sepktrospin, Fallenden). Sodium 3-(trimethylsilyl)propylsulfonate was used as external standard.

Figure 3:
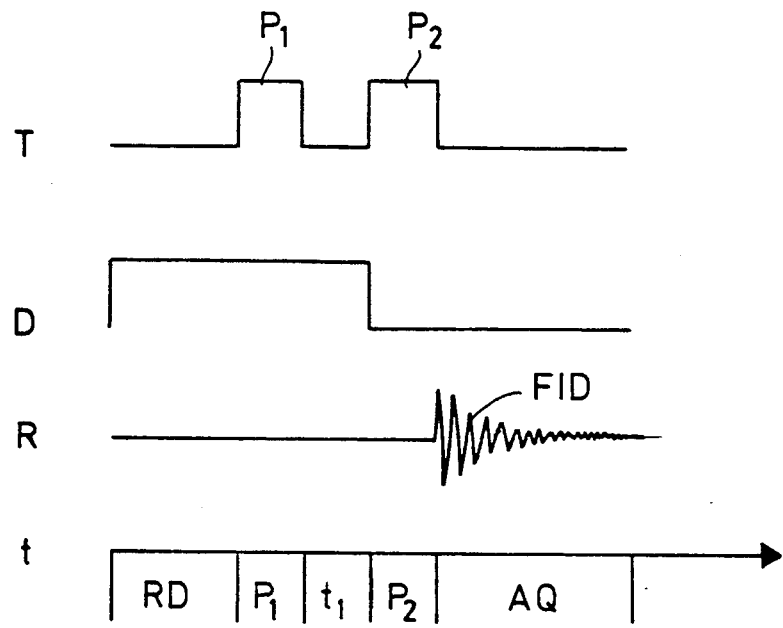
FIG. 3 shows a diagram to explain the pulse sequence which was used to record the spectrum shown in FIG. 2.

The pulse sequence is shown diagrammatically in FIG. 3.

The decoupler D ensures presaturation of the $H_2O$ signal. The relaxation delay time RD is approximately in the range of 1 second. A 90° high-frequency pulse $P_1$ (6.3 $\mu$s) is then radiated.

After an evolution time $t_1$ after which the decoupler no longer transmits a saturation signal, a further 90° high-frequency pulse $P_2$ is transmitted from the transmitter T and the free induction decay FID is then measured during the acquisition time AQ by the receiver R.

The evolution time $t_1$ is incremented in time steps $t_{in}$, $t_1$ passing from $t_{1min}$ to $t_{1max}$, $t_{in}$ being defined by the desired spectral width SW and the following applying:

$$t_{1max} = t_{1min} + (TD1 - 1)t_{in}$$

$t_{1max}$ = maximum of evolution time $t_1$
$t_{1min}$ = minimum of evolution time $t_1$ (for example 5 $\mu$s)
TD1 = number of measuring points in the time domain in FID (FID = Free Induction Decay)
$t_{in}$ = time steps during incrementing (for example $t_{in}$ = 348 $\mu$s)
AQ = acquisition time
$P_1$ = 6.3 $\mu$s = time range of 90° high-frequency pulse $P_1$
$P_2$ = 6.3 $\mu$s = time range of further 90° high-frequency pulse $P_2$
SW = spectral width In order to improve the signal-to-noise ratio, the measurement is repeated n times for each relative time point $t_1$ and accumulated.

Further typical parameters are AQ = 0.356 seconds, RD = 1 second, $P_1 = P_2 = 6.3$ $\mu$s, $t_{1min} = 5$ $\mu$s, $t_{in} = 348$ $\mu$s and TD1 = 200, n = 32, SW = 2874 Hz and TD2 = 2048.

After the measurement, a TD1 $\times$ TD2 data matrix in the time domain is obtained, which, via a 2D Fourier transform, gives a corresponding matrix in the frequency domain.

As already mentioned, these measurements and the measurements described below can be so restricted that they essentially yield the sections of interest (vicinity of the cross-peaks) of the spectra shown in FIGS. 5 to 11. These can then be obtained in a shorter time or, for the same measurement time, with better resolution.

Figure 2:
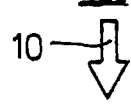
FIG. 2 shows a 400 MHz proton 2D-COSY spectrum of a tissue sample, obtained by biopsy, from a female cervix uteri, in a phosphate buffer/$D_2O$ mixture, which cervix uteri is in a chemical normal state.
Figure 2:
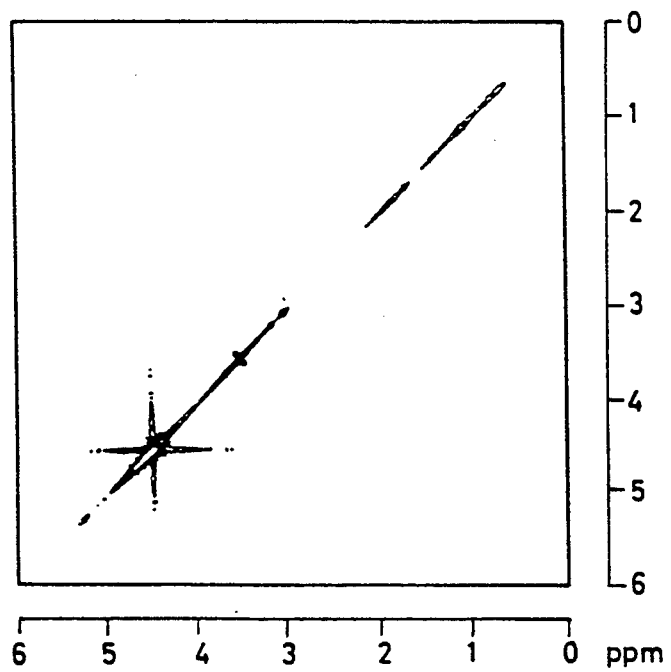

FIG. 2 shows a contour plot of the two-dimensional COSY spectrum of the tissue sample designated "NORMAL" in FIG. 1. The contour lines present in the diagonals show a contour line intensity profile which corresponds to a one-dimensional spectrum. The chemical shifts in ppm compared with the standard in the horizontal scale below are to be regarded in the same way as in a one-dimensional NMR. As can be seen from FIG. 2, apart from the star-shaped formation of the residual water signal at 4.7 ppm, no cross-peaks occur either side of the diagonal.

Figure 5:
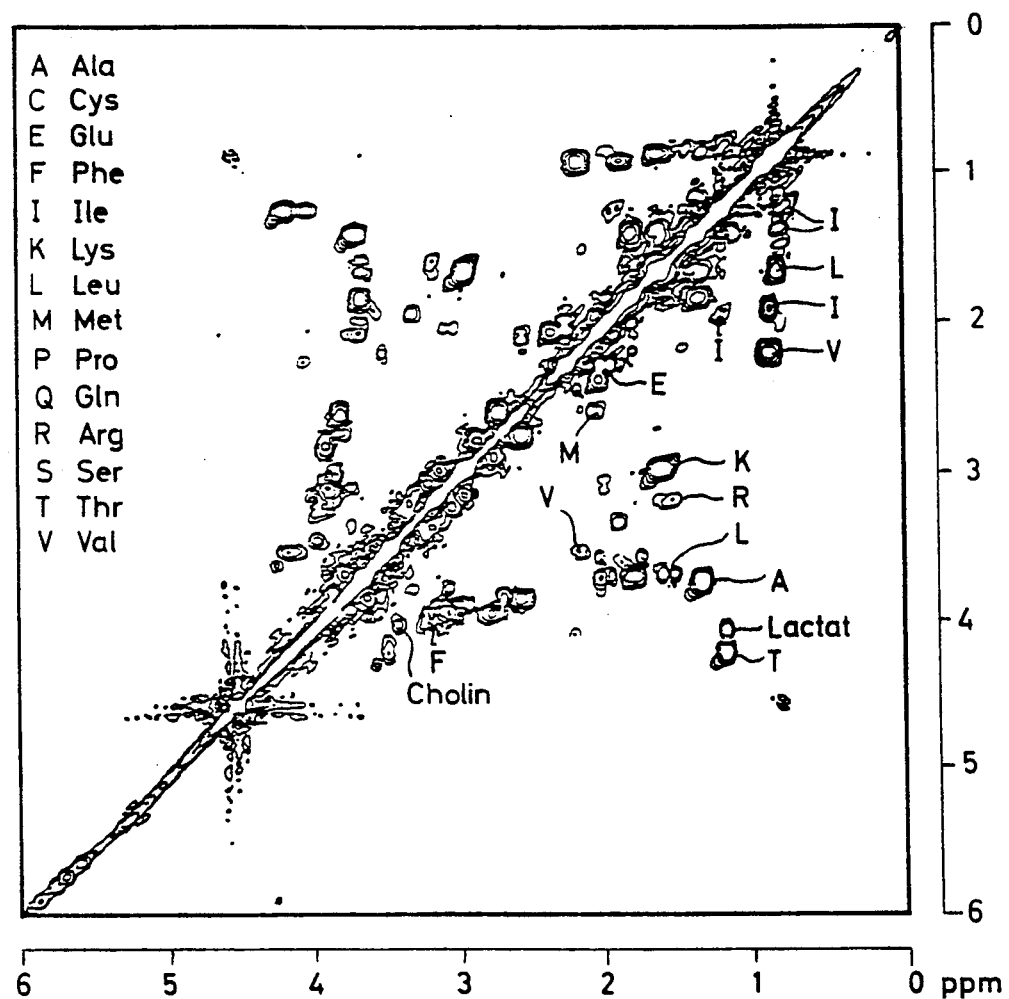
FIG. 5 shows a spectrum, corresponding to the spectrum of FIG. 2, of a tissue sample from a cervix uteri in advanced, invasive cancer state.

The 2D-COSY spectrum shown in FIG. 5 was obtained by measurement of a cervix uteri tissue sample of an invasive carcinoma, that is to say as shown on the right-hand side in FIG. 1. It can be seen from the comparison between FIGS. 2 and 5 that numerous cross-peaks can be found in pairs symetrically to the diagonal. The allocation of these cross-peaks to the individual transition states between the state shown in FIG. 2 and the state shown in FIG. 5 is carried out on the basis of the spectra shown in FIGS. 6 to 11.

In the spectra shown in FIGS. 6 to 11, the upper left-hand half of the triangle corresponds to the upper left-hand triangle of the representation in FIG. 5, that is to say to the spectrum of the invasive cancerous tissue. In the sequence of spectra in FIGS. 6 to 11, only those additional cross-peaks which occur in addition to a previously recorded state are shown in each case in the right-hand bottom triangle, without the cross-peaks which previously occurred being shown again.

Figure 6:
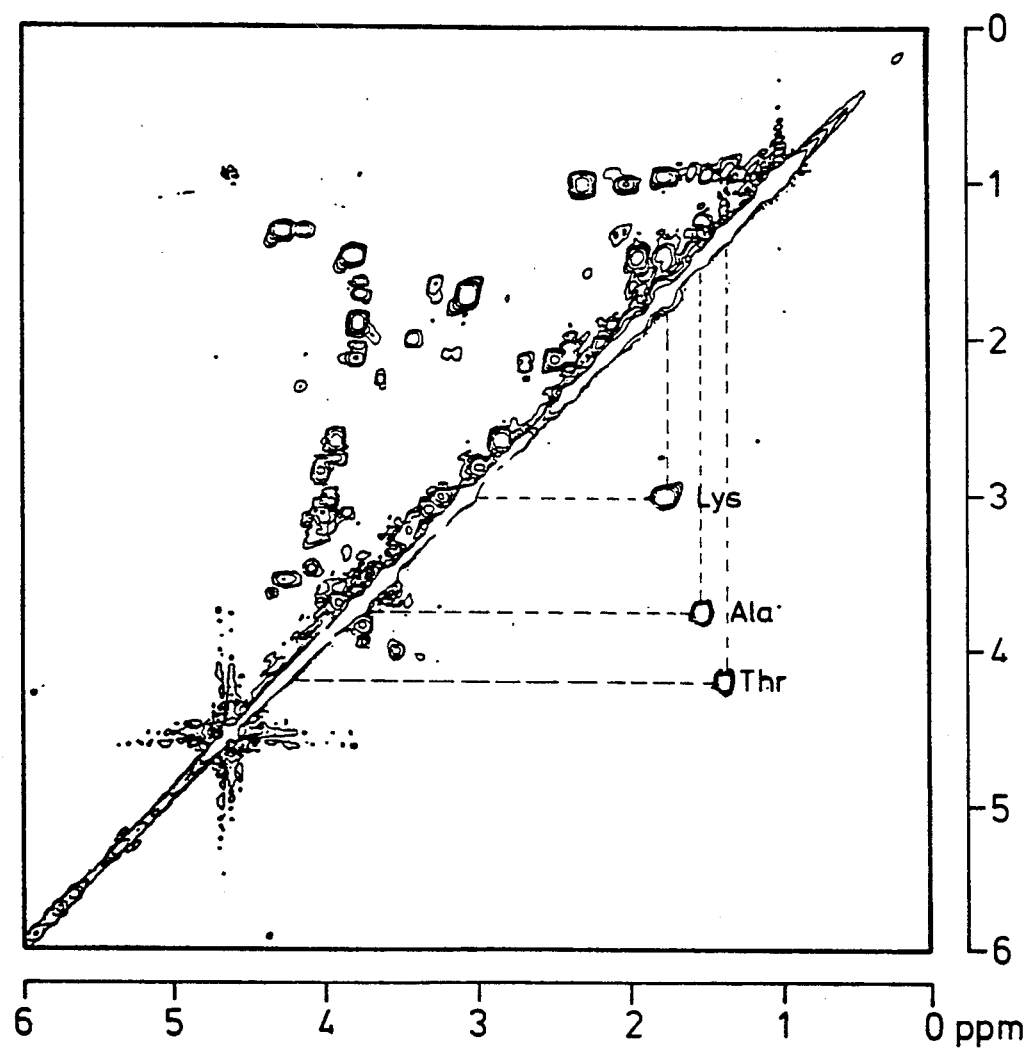
FIGS. 6 to 11 show 2D-COSY spectra, corresponding to the spectrum of FIG. 2, showing various successive chemical transition states of tissue samples between the healthy state shown in FIG. 2 and the state shown in FIG. 5, the cross-peaks additionally occurring in the particular transition state being shown in each case in the right-hand lower half of the triangle in the figure.

The spectrum shown in FIG. 6 corresponds to the state of the tissue characterized by HPV in FIG. 1, that is to say the tissue was infected by a papilloma virus.

For this state, characteristic cross-peaks for the amino acids lysine (Lys, K), alanine (Ala, A) and threonine (Thr, T) occur in the spectrum.

Figure 7:
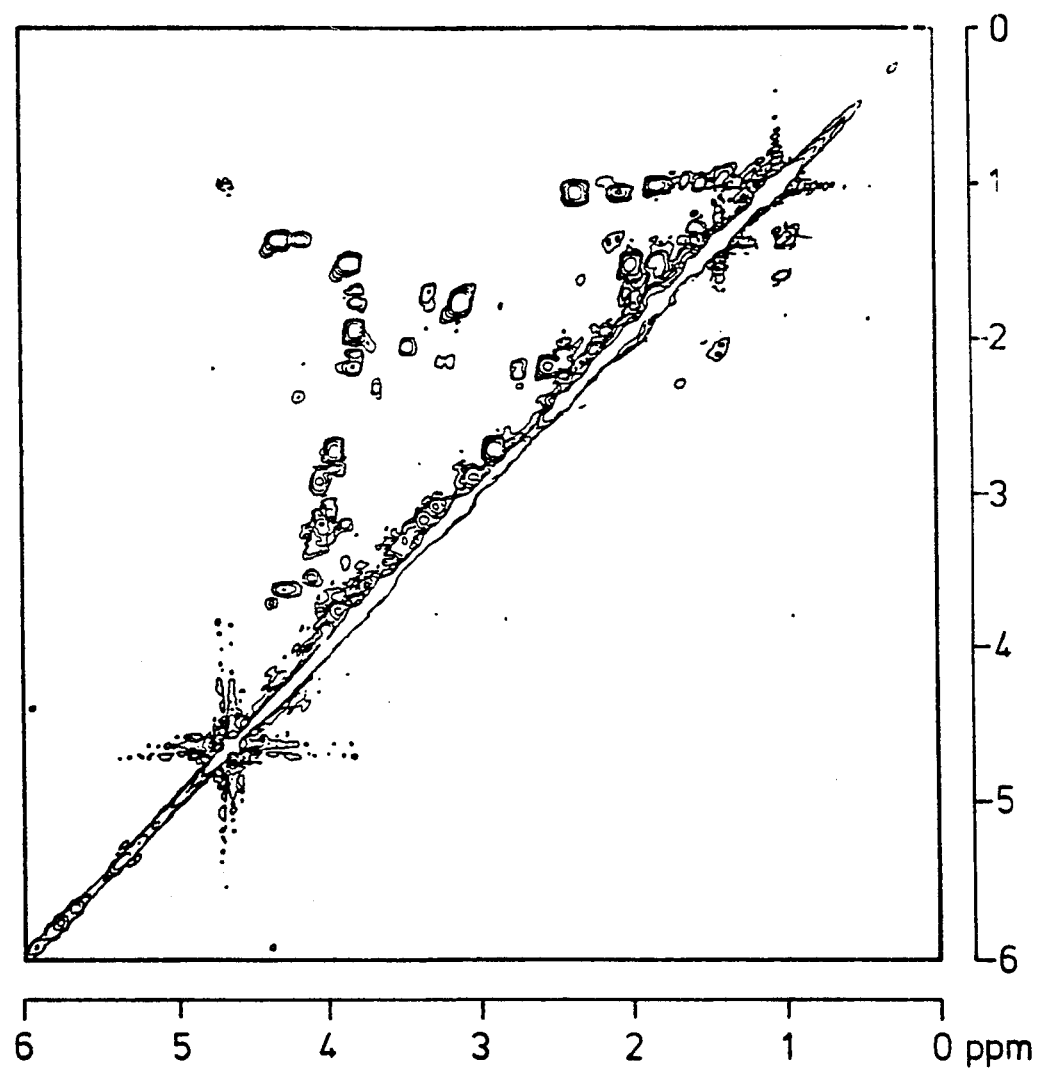

The spectrum shown in FIG. 7 corresponds to the state with slight dysplasia which has the reference grade 1 in FIG. 1. In this state changes are already taking place in the cell membranes, this being manifested by cross-peaks which appear in the range of about 0.8 and 1.3 ppm (horizontal scale). These cross-peaks can be assigned to lipid structures.

Figure 8:
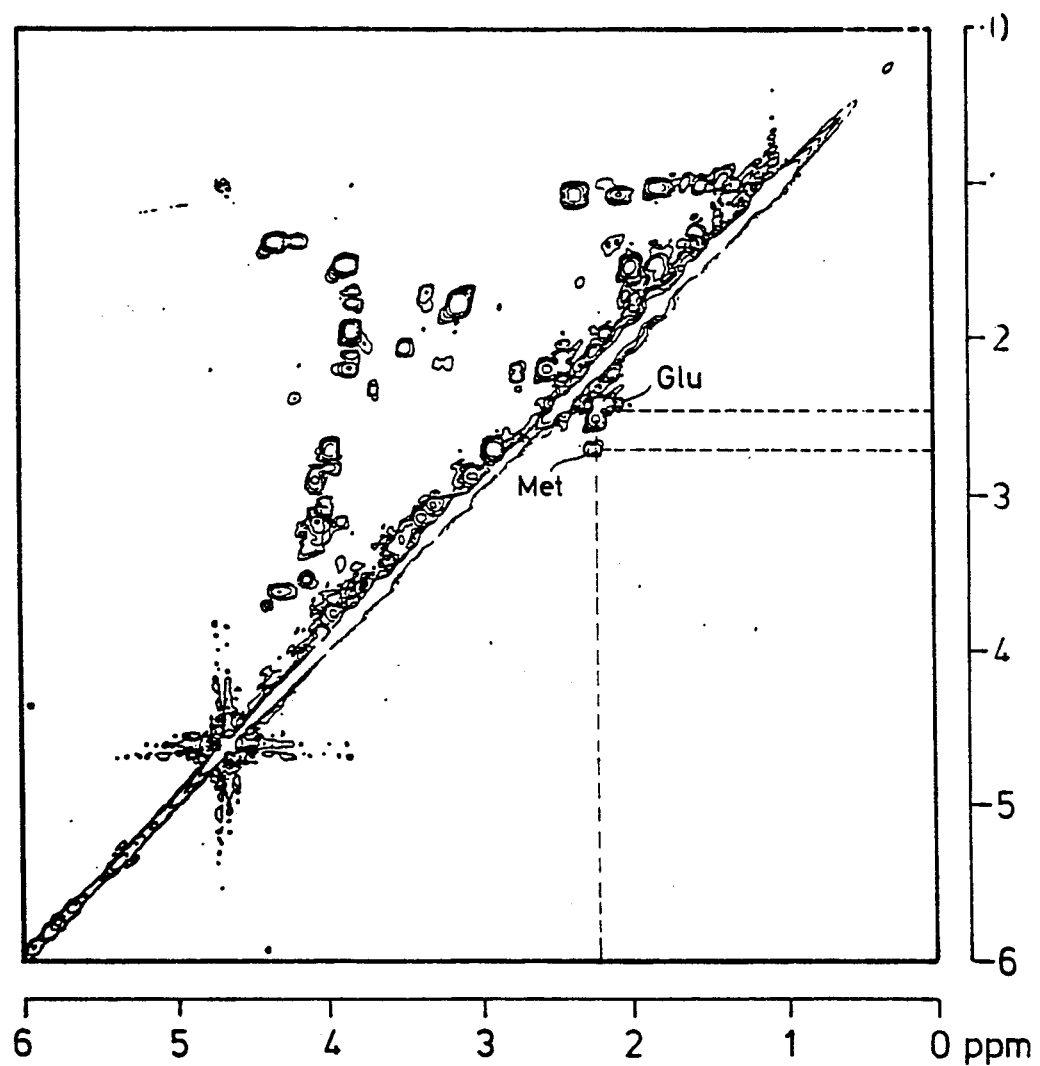

The spectrum shown in FIG. 8 corresponds to a state with advancing dysplasia designated as grade 2 in FIG. 1. In this state of change, the vacuoles present as a result of the HPV infection and the cross-peaks assigned to the HPV decrease. The characteristic cross-peaks for methionine (Met, M, 2.2 ppm–2.6 ppm) and glutamic acid (Glu, E, 2.2 ppm–2.4 ppm) occur.

The cross-peaks which occurred for the first time in FIGS. 6 and 7 can be compiled in a group of "non-critical" cross-peaks and the cross-peaks which occurred for the first time in FIG. 8 can be compiled in the "dubious" group. The data (for example chemical shift, intensity) of these cross-peaks are stored in a data processing installation.

If a tissue sample is taken from a female test person in accordance with the method described above and subjected to a 2D-COSY measurement as described above, and if the data determined (for example chemical shift, intensity) are compared with the stored data, the cross-peaks of the amino acids lysine, threonine and alanine recorded in FIG. 6 allow the conclusion to be drawn that a HPV infection exists. This fact on its own is reason to arrange for corresponding follow-up tests at intervals of about 1 to 2 years, in order to establish whether cross-peaks such as are shown in FIGS. 7 and 8 appear following the HPV infection. If such cross-peaks are determined it can then be concluded therefrom that a developing dysplasia exists.

Figure 9:
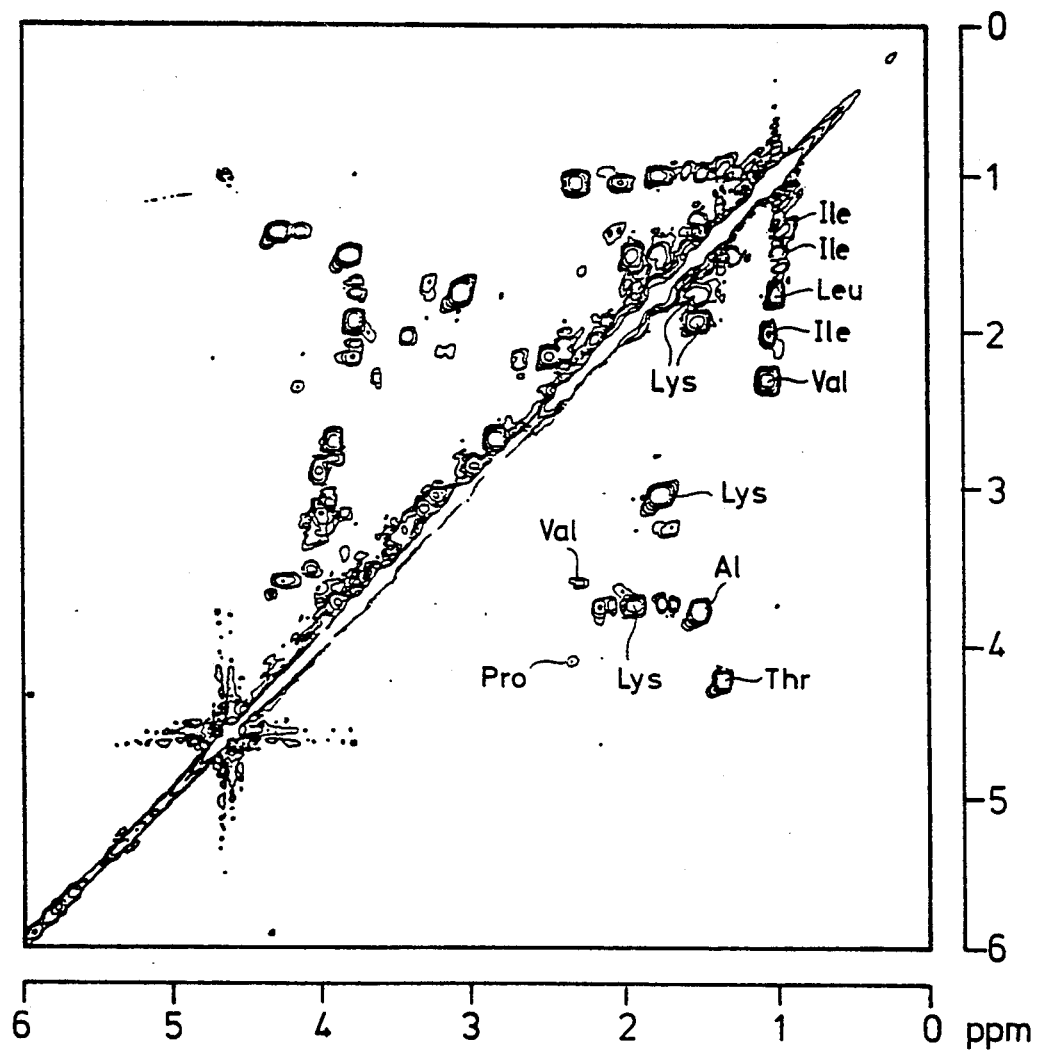

FIG. 9 shows a 2D-COSY spectrum of a tissue sample as graded in the grade 3 category in FIG. 1. In this "pre-malignant" state, an increased number of amino acid cross-peaks occur, in particular those of isoleucine (Ile, I), leucine (Leu, L), valine (Val, V), threonine (Thr, T), alanine (Ala, A), proline (Pro, P) and lysine (Lys, K).

Figure 10:
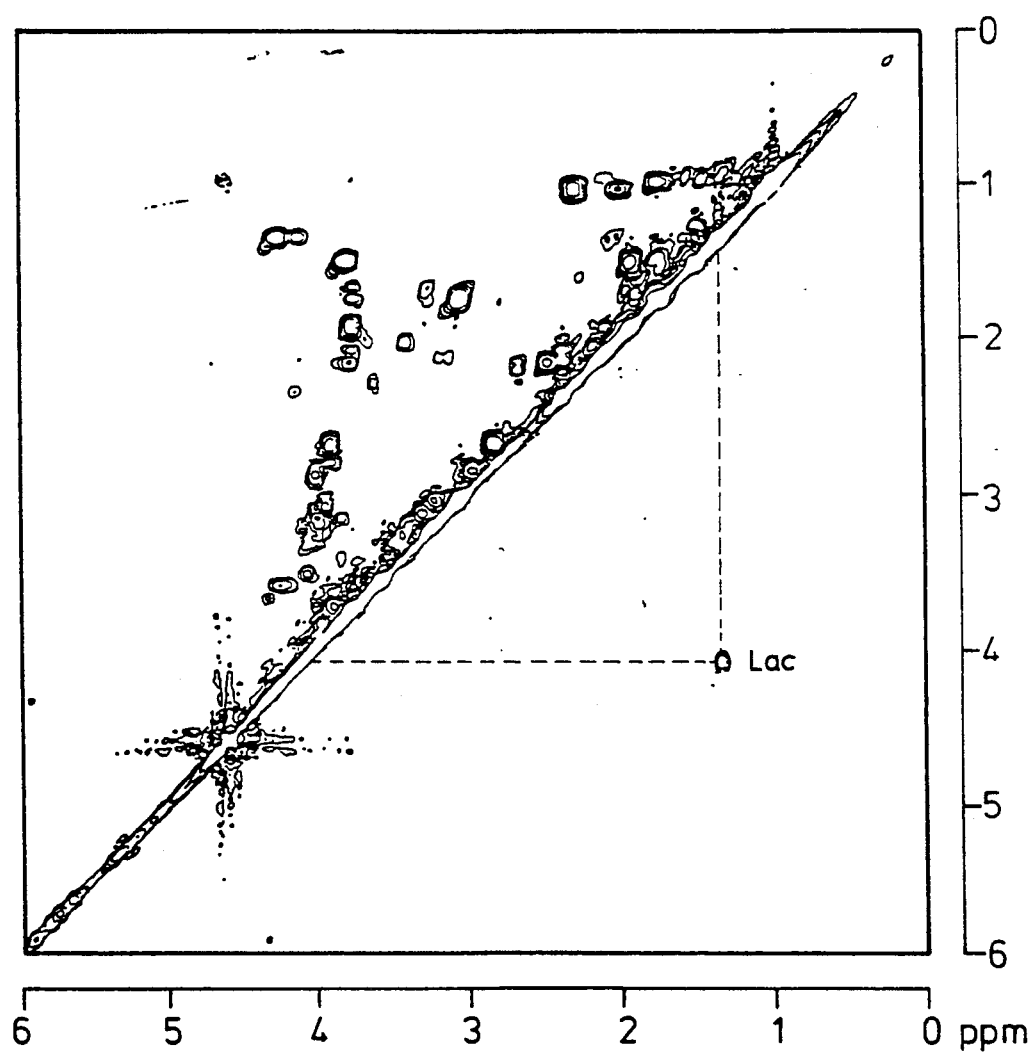

This state, which is shown in FIG. 9, can be clearly differentiated from the state shown in FIG. 10, which has an additional cross-peak at 1.4 ppm–4.1 ppm, which is to be assigned to lactate. The lactate cross-peak occurs for the first time in a very early state of an invasive carcinoma but was never found in the state corresponding to that in FIG. 9.

Thus, the lactate cross-peak is a possible clear differentiation feature for distinguishing the state in FIG. 9, which is still to be designated as a "pre-malignant" stage, from the "early invasive" state of FIG. 10. A tissue state as represented by the spectrum shown in FIG. 9 cannot yet be recognised as a carcinoma by a histological examination and, therefore, it was entirely possible for this stage still to be classified in, for example, "grade 2" stages by histological methods. If it is taken into consideration that the time taken to progress from a grade 3 state to CIS is about 1 year, the significance of the clear differentiability precisely in this end development stage, that is to say the clear difference between the "pre-malignant" stage and the "early invasive" stage, becomes apparent.

The stage shown in FIG. 10 corresponds to a very early CIS stage, so that this chemical state can be recognised substantially earlier and more reliably than by conventional histological methods. Thus, in 19 cases the "early invasive" CIS state was clearly established by the method according to the invention although other methods had still graded 7 of these cases as "pre-malignant".

In order to be able to differentiate CIS from invasive carcinoma the pathologist must find fully developed cancer cells outside the epithelium. The pre-invasive and invasive cancer cells cannot be differentiated on the basis of their morphology. Furthermore, using conventional histological or cytological methods the pathologist is not able to recognise whether a pre-invasive state will continue to develop into an invasive state or will regress into the normal state.

Figure 11:
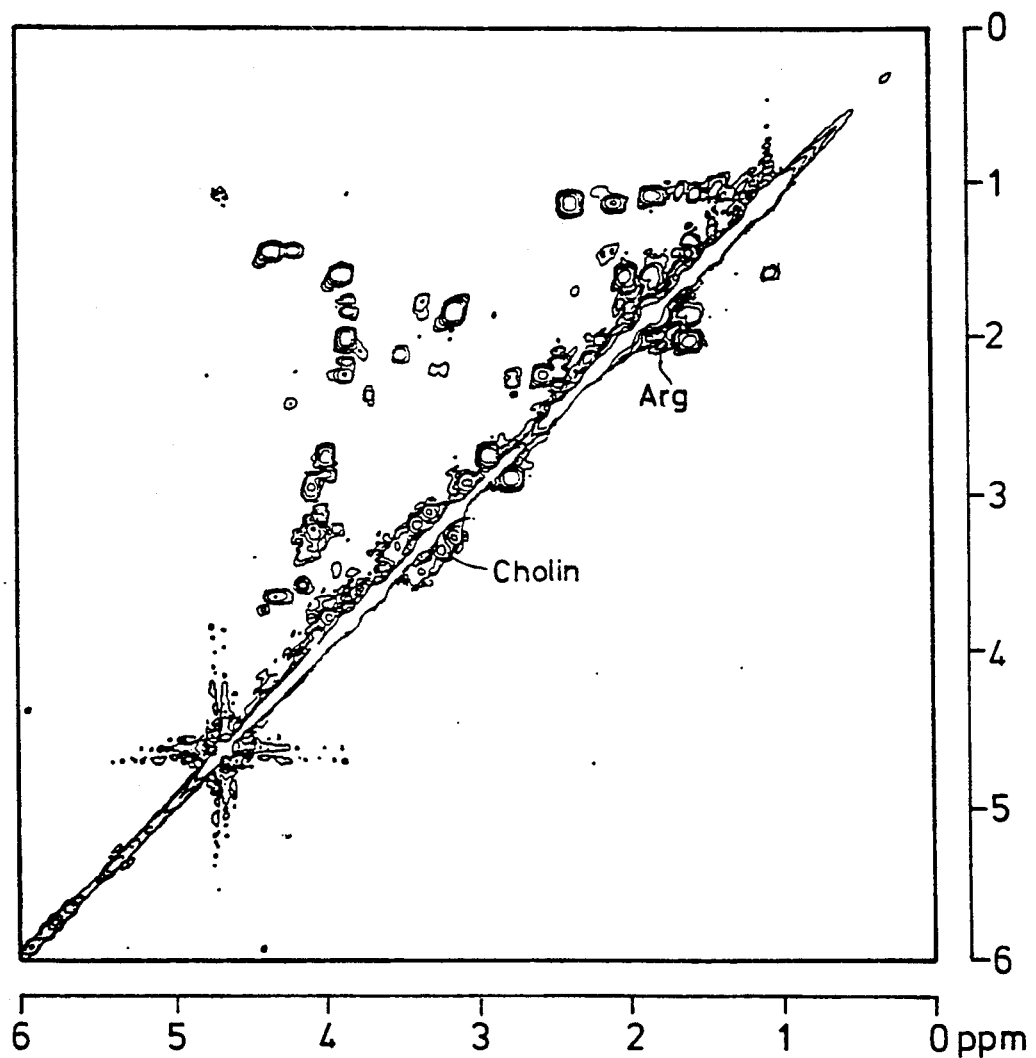

FIG. 11 shows a state which corresponds to an advanced invasive carcinoma and which is characterized by additional cross-peaks of arginine (Arg, R) and choline.

The data for the cross-peaks which have occurred for the first time in each of the spectra of FIGS. 6 to 11 are in each case stored in groups and the data for the spectra of actual tissue samples are compared with these data and accordingly assigned to the previously mentioned group classifications "non-critical", "dubious", "pre-malignant", "early invasive" and "advanced invasive". On the basis of these allocations, diagnoses can then be made and treatment methods carried out.

Comparable results were also obtained with other tissue samples from the human body, that is to say with intestinal, lung, lymph node and skin tissue.

Figure 4:
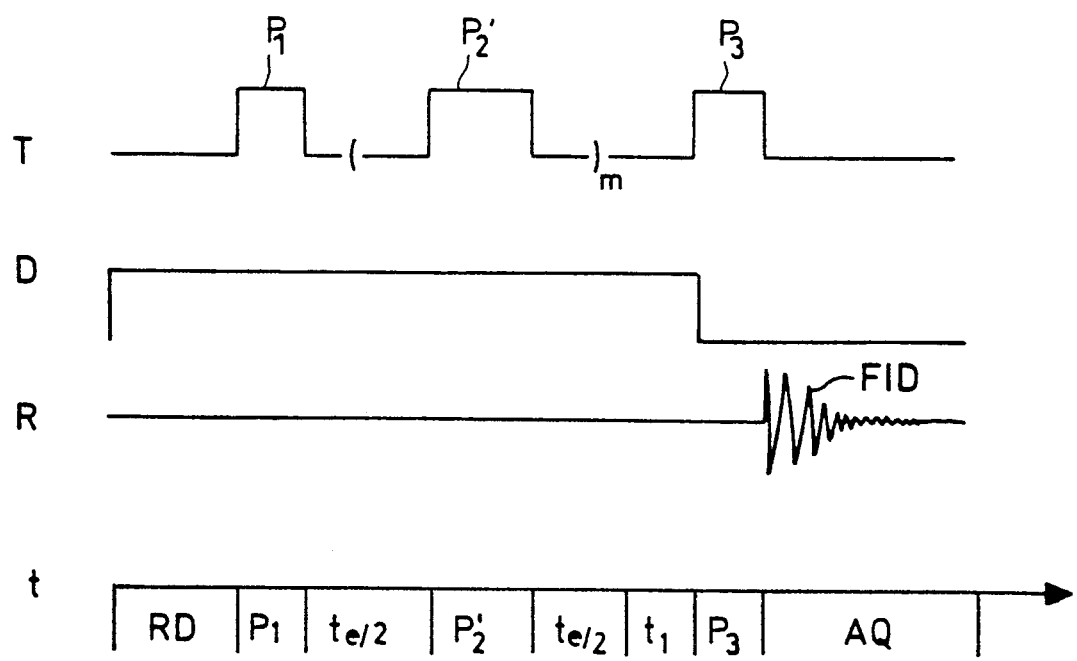
FIG. 4 shows a diagram of a pulse sequence with $T_2$ filtering.

FIG. 4 shows the pulse sequence of a 2D-COSY measurement method in which a $T_2$ filtering of undesired signals was carried out. This serves to filter out non-specific signals and to carry out measurements only on the characteristic cross-peaks, for example those of FIGS. 6 to 10.

With this procedure, a transmitter T radiates a 90° high-frequency pulse $P_1$ as excitation and after a period $t_e/2$ 180° high-frequency pulses $P_2'$ are radiated until the following condition is met:

$$m \cdot t_e > T_2$$

m = number of 180° high-frequency pulses $P_2'$ (see FIG. 3)

$t_e$ = evolution time between pulse $P_1$ and $P_3$, without considering pulses $P_2'$ $t_e/2$ = after this time period, the additional 180° high-frequency pulses $P_2'$ are radiated $T_2$ = transverse relaxation time value for the undesired signal components A third 90° pulse $P_3$ is then radiated and the free induction decay FID is then measured. The decoupler D provides a corresponding pre-saturation of the water signal up to the pulse $P_3$.

In order to save measurement time it is possible, for example, to carry out a selective two-dimensional or one-dimensional COSY experiment instead of the measurement described above. The usually broad-band excitation pulse $P_1$, $P_1'$ can be replaced by a selective pulse of restricted band width (for example amplitude-modulated pulse having the shape of a Gauss or Sinc function). By this means, the number of necessary $t_1$ points can be greatly reduced in order to detect only the most important striated regions of the 2D matrix.

It is thus possible to measure cross-peaks which are characteristic of certain states, for example the cross-peaks described in FIGS. 6 to 8, in a targeted manner in order to decide whether the tissue measured is or is not in a non-critical phase. Accordingly, the additional cross-peaks shown in FIGS. 9 and 10 can then be measured in a targeted manner in order to determine the transition state between "pre-malignant" and "early invasive" state.

It is also possible first to insert a one-dimensional spectrum, which may also be filtered, before carrying out the 2D-COSY spectra. By this means, those lines can be determined which are already assignable in a one-dimensional spectrum as characteristic of transition states. On the basis of the preliminary information obtained from the one-dimensional spectra, it is then possible already to carry out the measurement frequency-selectively (for example by means of the first pulse $P_1$ or $P_1'$). This again shortens the measurement time.

Other 1D or 2D measurement sequences which are particularly suitable for the detection of selected peaks, for example I-modulation, scalar or dipolar selective or non-selective correlation, can also be used in the method according to the invention.

Figure 12:
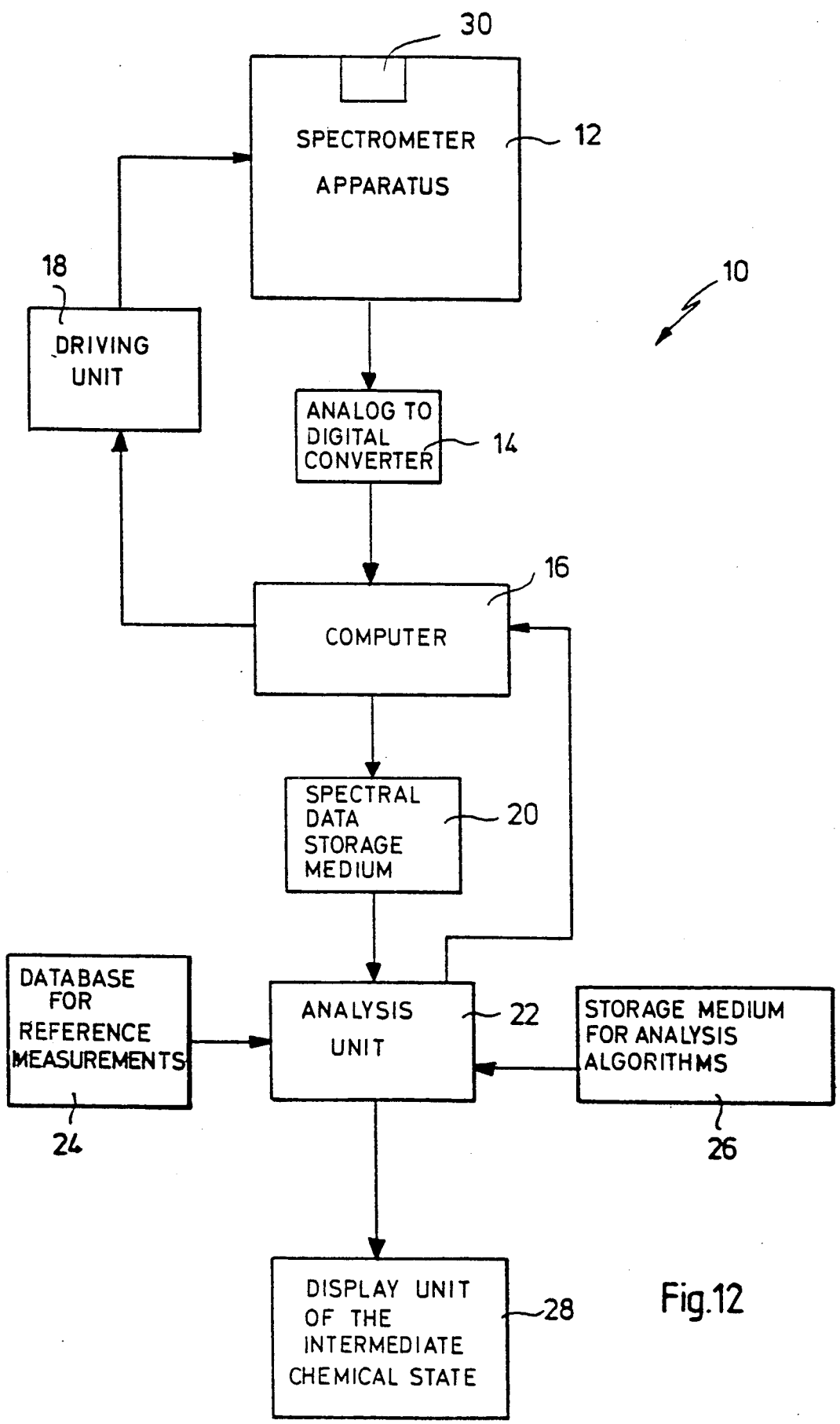
FIG. 12 shows, highly diagrammatically, an apparatus according to the invention.

An apparatus 10 for carrying out the method described above is shown highly diagrammatically in FIG. 12.

The apparatus 10 has a high-resolution nuclear magnetic resonance spectrometer 12, for example the Bruker WM-400 spectrometer mentioned above.

The spectrometer 12 is connected to an analog-digital converter 14, which supplies the analog data detected by the spectrometer 12 in digitalised form to a computer 16. The computer 16 can, for example, transform the measured values obtained in the time domain to the frequency domain via a Fourier transform.

The computer 16 supplies the data to a spectral data memory 20.

The spectral data memory 20 transmits its data to a computation unit 22.

The computation unit 22 is connected to a database 24 in which data records of measured values from reference measurements are stored.

The data records contain all of the available measured values for a tissue between a chemically normal (healthy) state and a chemically abnormal end state (highly invasive carcinoma). The measured values themselves can be reduced already processed, in particular to characteristic features, such as, for example, intensity threshold values.

The computation unit 22 is connected to a memory 26 for a computation algorithm.

The memory 26 can contain various computation routines which are matched to the particular selected type of desired computation. Via the computation routine it is possible, for example, to search the data records in the database 24 only for specific predefined values; it is, of course, possible also to search all values and to compare these with all data detected by the spectrometer in an actual measurement. For this purpose the computation unit 22 is connected to the computer 16. The computer is also connected via a control unit 18 to the spectrometer 12.

The computation unit 22 is connected to an output unit 28 for displaying the chemical transition state.

The evaluation unit 28 can present the result of the computation in the manner desired in the particular case, for example as a numerical value, as a spectrum or also as a readable result, use being made, for example, of the classification shown in FIG. 1.

This facilitates conveying of results of routine tests to the extent that the current state of the tissue can be output in readable form, for example as CIN, grade 1, "slight dysplasia".

In the case of tissue tests in vitro, a sample head 30 of the spectrometer 12 is designed in such a way that a measurement tube which holds the tissue sample can be inserted.

It is, of course, also possible to design the sample chamber of the spectrometer 12 in such a way that in vivo measurements can be carried out. It is then, for example, possible to measure areas of the body using surface HF coils. In the case of examination of the uterus it is also possible to introduce an appropriate probe into the lower abdomen.

We claim:

1. Method for determining chemical states of living animal or human tissue using nuclear magnetic resonance with a homogeneous constant magnetic field, the tissue being measured by means of a nuclear magnetic resonance measurement and the measured values obtained then being evaluated by comparison with measured values from reference measurements on comparable tissue to assess whether the chemical state of the tissue corresponds to a chemical normal state or to a deviating abnormal end state, wherein the measured values obtained are compared with such a series of reference measurements which also contain detectable characteristic transition states between the chemical normal state and the abnormal end state, and wherein the chemical transition state of the measured tissue sample is determined from the comparison.

2. Method as claimed in claim 1, wherein the tissue is measured using a high-resolution, two-dimensional, scalar correlation spectroscopy (2D-COSY), nuclear magnetic resonance measurement, and the measured values obtained are compared with a series of reference values for chemical transition states of corresponding tissue.

3. Method as claimed in claim 2, wherein at least one characteristic cross-peak is selected as criterion for the comparison between actual measured values for the tissue and the series of reference measured values and it is then determined whether or not the at least one cross-peak is present.

4. Method as claimed in claim 3, wherein the tissue is irradiated frequency-selectively with one or more high-frequency pulses $P_1$ generating transverse magnetization, during a high-resolution two-dimensional nuclear magnetic resonance measurement of the tissue, the band width of the high-frequency pulse comprising at least the resonance frequency of a molecule characteristic for a chemical transition state.

5. Method as claimed in claim 4, wherein on carrying out the nuclear magnetic resonance measurement, after radiation of the first high-frequency pulse $P_1$ generating the transverse magnetization, and before a pulse $P_3$ used for a measurement of the free induction decay FID is radiated, further 180° high-frequency pulses $P_2'$ are radiated in a number until, concerning undesired signals, the condition $m \cdot t_e > T_2$ is met, where m is the number of further high-frequency pulses $P_2'$, $t_e$ is the spin echo evolution time, and $T_2$ is the transverse relaxation time of the undesired signals.

6. Method as claimed in claim 5, wherein the chemical transition states between normal state and deviating end state are subdivided into the groups non-critical, dubious and pre-malignant states, and the corresponding measured values for the reference measurements are assigned to these groups of states so that on comparison of the measured values obtained for the measured tissue sample an allocation to a group of pre-defined chemical transition states is obtained at the same time.

7. Method as claimed in claim 6, wherein those values which correspond to chemical intermediate states of the tissue which originate from chemical changes which are not directly involved in the direct chemical transformation process between the normal state and the abnormal end state, it being possible, however, for said changes to lead to the transformation process leading to the abnormal chemical end state, are added to the series of reference measured values.

8. Method as claimed in claim 7, wherein a tissue sample obtained by biopsy or a cell mass obtained by culture is subjected to the high-resolution nuclear magnetic resonance measurement in vitro.

9. Method as claimed in claim 8, wherein the evaluation is carried out on those cross-peaks in a 2D-COSY proton spectrum which correspond to the metabolites characteristic for the transformation process.

10. Method as claimed in claim 9, wherein a tissue sample from the neck of the uterus (cervix uteri) is used and wherein if cross-peaks of at least one of the amino acids isoleucine (Ile), leucine (Leu), valine (Val) and/or phenylalanine (Phe) are present in the tissue sample the chemical state thereof is assessed as "pre-malignant".

11. Method as claimed in claim 10, wherein evaluation is also carried out for cross-peaks which are assignable to lactate and wherein such a chemical state is classified as "early invasive" abnormal end state.

12. Method as claimed in one of claims 1 to 11, wherein a proton nuclear magnetic resonance measurement is carried out in which the $H_2O$ signal is suppressed by pre-saturation.

13. Method as claimed in claim 9, wherein evaluation is also carried out for cross-peaks which are assignable to lactate and wherein such a chemical state is classified as "early invasive" abnormal end state.

14. Method as claimed in one of claims 2 to 7, wherein the evaluation is carried out on those cross-peaks in a 2D-COSY proton spectrum which correspond to the metabolites characteristic for the transformation process.

15. Method as claimed in one of claims 1 to 6, wherein a tissue sample obtained by biopsy or a cell mass obtained by culture is subjected to the high-resolution nuclear magnetic resonance measurement in vitro.

16. Method as claimed in one of claims 1 to 5, wherein those values which correspond to chemical intermediate states of the tissue which originate from chemical changes which are not directly involved in the direct chemical transformation process between the normal state and the abnormal end state, it being possible, however, for said changes to lead to the transformation process leading to the abnormal chemical end state, are added to the series of reference measured values.

17. Method as claimed in one of claims 1 to 4, wherein the chemical transition states between normal state and deviating end state are subdivided into the groups non-critical, dubious and pre-malignant states, and the corresponding measured values for the reference measurements are assigned to these groups of states so that on comparison of the measured values obtained for the measured tissue sample an allocation to a group of pre-defined chemical transition states is obtained at the same time.

18. Method as claimed in one of claims 2 or 3, wherein on carrying out the nuclear magnetic resonance measurement, after radiation of the first high-frequency pulse $P_1$ generating the transverse magnetization and before a pulse $P_3$ used for a measurement of the free induction decay FID is radiated, further 180° high-frequency pulses $P_2'$ are radiated in a number until, concerning desired signals, the condition $$m \cdot t_e > T_2$$

is met, where m is the number of further high-frequency pulses $P_2'$, $t_e$ is the spin echo evolution time, and $T_2$ is the transverse relaxation time of the undesired signals.

19. Method as claimed in claim 2, wherein the tissue is irradiated frequency-selectively with one or more high-frequency pulses, generating the transverse magnetization, during a high-resolution two-dimensional nuclear magnetic resonance measurement of the tissue, the band width of the high-frequency pulse comprising at least the resonance frequency of a molecule characteristic for a chemical transition state.

20. Apparatus for determining chemical states of living animal or human tissue using nuclear magnetic resonance, comprising a nuclear magnetic resonance spectrometer (12) for carrying out a nuclear magnetic resonance measurement on the tissue, computer means (16) for determining measured values for the nuclear magnetic resonance measurement on the tissue, means (24) for storing reference values of measurements on comparable tissue, means for comparing the measured values for actual measurement and reference measurement, and a computation means (22) connected to said means for comparing for making an assignment of the actual measurement to a chemical transition state based on a comparison of the measured values wherein the means (24) for storing reference values consist of a database which contains such a series of reference values for reference measurements which also comprise detectable characteristic transition states between the chemical normal state and the chemically abnormal end state.

21. Apparatus as claimed in claim 20, further comprising a memory (26) for storing a computation algorithm, a spectral data memory (20) and an output unit (28), wherein the computation means (22) is connected to the database (24) and to the memory (26) for a computation algorithm and computes the actual measured values supplied from the spectral data memory (20) and supplies the result to the output unit (28).

22. Apparatus as claimed in claim 21, further comprising a control unit (18), and wherein the computer means (16) is connected via the control unit (18) to the spectrometer (12), said computer means (16) also being connected to the computation means (22) and in series with the spectral data memory (20).

23. Apparatus as claimed in claim 22, wherein the spectrometer (12) contains a sample head (30) in order to measure an in vitro tissue sample.

24. Apparatus as claimed in one of claims 20 to 22, wherein the spectrometer has a sample receiver for receiving an animal or human body, and surface HF coils disposed within said receiver for surrounding a body received in said receiver and for facilitating an in vivo measurement.

25. Apparatus as claimed in one of claims 20 or 21, wherein the spectrometer (12) contains a sample head (30) in order to measure an in vitro tissue sample.

* * * * *